(12) United States Patent
Seo et al.

(10) Patent No.: US 11,574,984 B2
(45) Date of Patent: Feb. 7, 2023

(54) DISPLAY PANEL AND ELECTRONIC DEVICE INCLUDING THE SAME

(71) Applicant: Samsung Display Co., Ltd., Yongin-si (KR)

(72) Inventors: Youngwan Seo, Yongin-si (KR); Hyeongseok Kim, Yongin-si (KR); Junhyun Park, Yongin-si (KR); Yujin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 238 days.

(21) Appl. No.: 17/117,128

(22) Filed: Dec. 10, 2020

(65) Prior Publication Data

US 2021/0193782 A1     Jun. 24, 2021

(30) Foreign Application Priority Data

Dec. 23, 2019   (KR) .................. 10-2019-0173464

(51) Int. Cl.
*H01L 27/32*        (2006.01)
(52) U.S. Cl.
CPC ........ *H01L 27/3276* (2013.01); *H01L 27/326* (2013.01); *H01L 27/3258* (2013.01); *H01L 27/3272* (2013.01)
(58) Field of Classification Search
CPC ........ G09G 2300/0456; H01L 27/3276; H01L 27/3241; H01L 27/3244; H01L 27/326
See application file for complete search history.

(56) References Cited

U.S. PATENT DOCUMENTS

| 7,830,591 | B2 | 11/2010 | Shimodaira |
| 10,431,604 | B2 | 10/2019 | Cho et al. |
| 10,733,931 | B2 | 8/2020 | Jung et al. |
| 2019/0140028 | A1 | 5/2019 | Kim et al. |
| 2020/0211465 | A1* | 7/2020 | Jeong ............... H01L 27/3276 |
| 2021/0376049 | A1* | 12/2021 | Huang ............... H05K 1/025 |

FOREIGN PATENT DOCUMENTS

| CN | 113410263 A | * | 9/2021 | ......... H01L 27/3276 |
| CN | 114122074 A | * | 3/2022 | ........... G09G 3/3266 |
| KR | 10-2017-0113066 | | 10/2017 | |
| KR | 10-2018-0125061 | | 11/2018 | |

* cited by examiner

*Primary Examiner* — Mariceli Santiago
(74) *Attorney, Agent, or Firm* — H.C. Park & Associates, PLC

(57) ABSTRACT

According to one aspect of the invention, a display panel includes a first display area including a plurality of first pixels, a second display area surrounded by the first display area and including at least one transmissive portion and a plurality of second pixels spaced apart from each other with the transmissive portion therebetween, a plurality of first wiring lines electrically connected to the plurality of first pixels and substantially extending in a first direction, and a plurality of second wiring lines electrically connected to the plurality of second pixels and substantially extending in the first direction, wherein at least one of the plurality of first wiring lines includes a first portion, and a second portion located on a different layer from the first portion and overlapping one of the plurality of second wiring lines.

20 Claims, 15 Drawing Sheets

DISPLAY PANEL AND ELECTRONIC DEVICE INCLUDING THE SAME

CROSS-REFERENCE TO RELATED APPLICATION

This application claims priority from and the benefit of Korean Patent Application No. 10-2019-0173464, filed on Dec. 23, 2019, which is hereby incorporated by reference for all purposes as if fully set forth herein.

BACKGROUND

Field

Exemplary implementations of the invention relate generally to a display panel, more specifically, to a display panel having an area in which an electronic component arranged inside a display area and an electronic device including the display panel.

Discussion of the Background

Recently, the usage of display devices has diversified. Also, display devices have become thinner and lighter, and thus, the uses of display devices have expanded.

As the display devices may be utilized in various ways, various methods may be used to design the shapes of the display devices and the number of functions that may be embedded in or linked to the display devices has increased.

The above information disclosed in this Background section is only for understanding of the background of the inventive concepts, and, therefore, it may contain information that does not constitute prior art.

SUMMARY

Display panels and electronic devices including the same constructed according to exemplary implementations of the invention are capable of securing a high light transmittance in a region of a transmissive portion through which light/signals of an electronic component pass.

For example, by increasing the area of a transmissive portion through which light/signals of the electronic component pass, the display panel may have an expanded display area as well as various functions.

Additional features of the inventive concepts will be set forth in the description which follows, and in part will be apparent from the description, or may be learned by practice of the inventive concepts.

According to one aspect of the invention, a display panel includes a first display area including a plurality of first pixels, a second display area surrounded by the first display area and including at least one transmissive portion and a plurality of second pixels spaced apart from each other with the transmissive portion therebetween, a plurality of first wiring lines electrically connected to the plurality of first pixels and substantially extending in a first direction, and a plurality of second wiring lines electrically connected to the plurality of second pixels and substantially extending in the first direction, wherein at least one of the plurality of first wiring lines includes a first portion, and a second portion located on a different layer from the first portion and overlapping one of the plurality of second wiring lines.

The display panel may further include a conductive layer located between the second portion of the at least one first wiring line and the one second wiring line.

The conductive layer may overlap the second portion of the at least one first wiring line and the one second wiring line.

The display panel may further include a plurality of third wiring lines electrically connected to the plurality of first pixels or the plurality of second pixels and substantially extending in the first direction, wherein the conductive layer may be electrically connected to the plurality of third wiring lines.

The display panel may further include an insulating layer located between the third wiring line and the conductive layer, wherein the conductive layer may be connected to the third wiring line through a contact hole of the insulating layer.

The display panel may further include a first insulating layer and a second insulating layer located between the first portion and the second portion, wherein the conductive layer may be located between the first insulating layer and the second insulating layer.

Each of the first insulating layer and the second insulating layer may include an organic insulating material.

Each of the first insulating layer and the second insulating layer may include a hole corresponding to each of the plurality of transmissive portions.

A width of the conductive layer may be greater than each of widths of the first and second wiring lines.

A first distance between adjacent first wiring lines among the plurality of first wiring lines in the first display area may be greater than a second distance between adjacent first wiring lines among the plurality of first wiring lines in the second display area.

A third distance between adjacent second wiring lines among the plurality of second wiring lines in the first display area may be greater than a fourth distance between adjacent second wiring lines among the plurality of second wiring lines in the second display area.

The display panel may further include a light-blocking layer located under the second pixels.

The light-blocking layer may include a metal or black ink.

Each of the plurality of first wiring lines may transmit a data signal to the plurality of first and second pixels, and each of the plurality of second wiring lines may transmit a data signal to the plurality of first pixels.

Per equal area, the number of second pixels may be less than the number of first pixels.

According to another aspect of the invention, an electronic device includes a display panel including a first display area and a second display area surrounding the first display area, and an electronic component arranged to correspond the second display area of the display panel, wherein the display panel includes a plurality of first pixels arranged in the first display area, at least one transmissive portion and a plurality of second pixels spaced apart from each other with the transmissive portion therebetween arranged in the second display area, a plurality of first wiring lines electrically connected to the plurality of first pixels and substantially extending in a first direction, and a plurality of second wiring lines electrically connected to the plurality of second pixels and substantially extending in the first direction, wherein a portion of at least one of the plurality of first wiring lines and a portion of at least one of the plurality of second wiring lines overlap each other around the transmissive portion.

The electronic component may include an imaging device or a sensor.

The display panel of the electronic device may further include a conductive layer located between the portion of the at least one first wiring line and the portion of the at least one second wiring line.

The conductive layer may overlap the portion of the at least one first wiring line and the portion of the at least one second wiring line.

A width of the conductive layer may be greater than each of widths of the first and second wiring lines.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

Figure 6A:
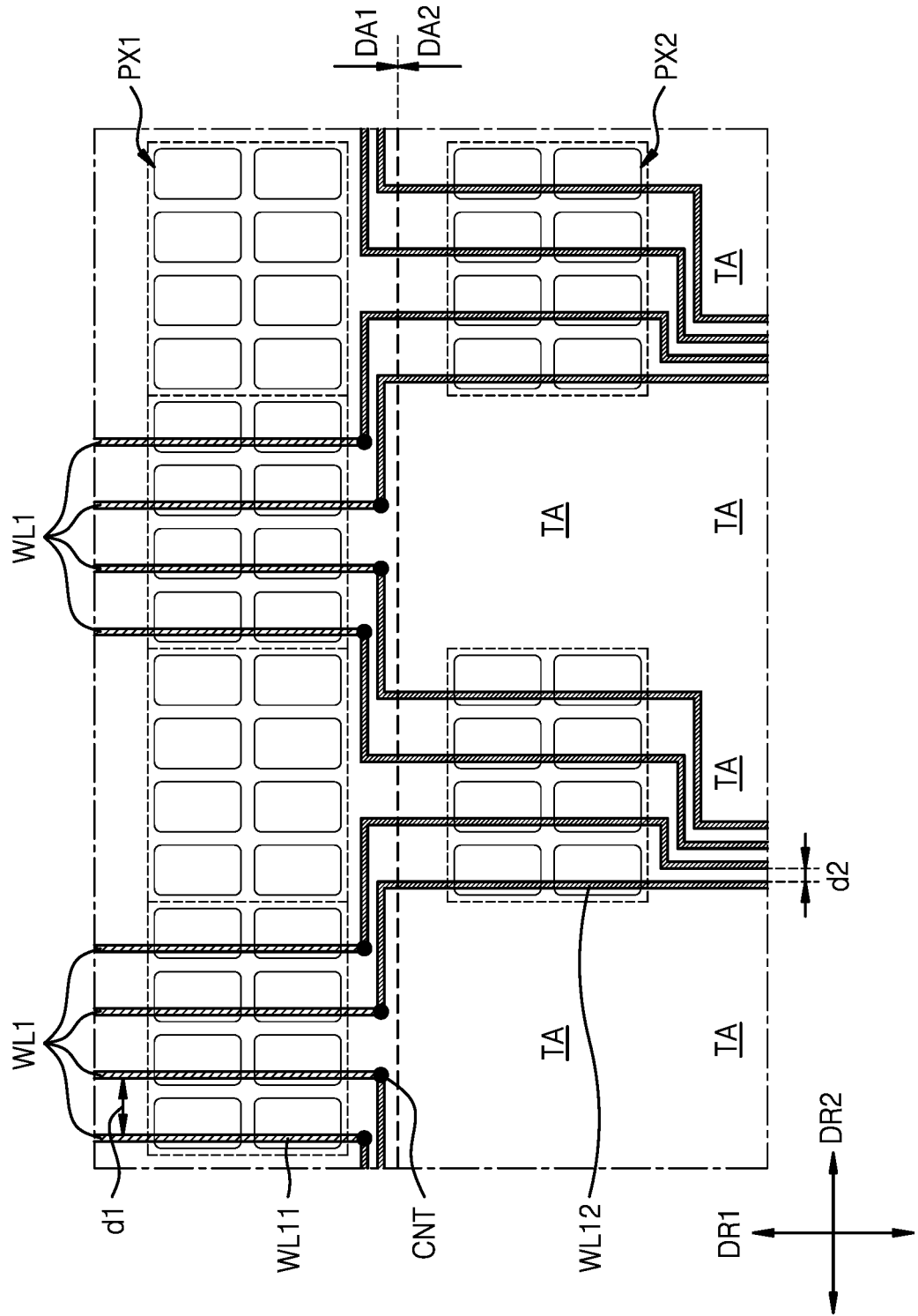
FIGS. 6A to 6E are schematic plan views illustrating an arrangement relationship between pixels and wiring lines of a display panel constructed according to the principles of the invention.
Figure 6B:
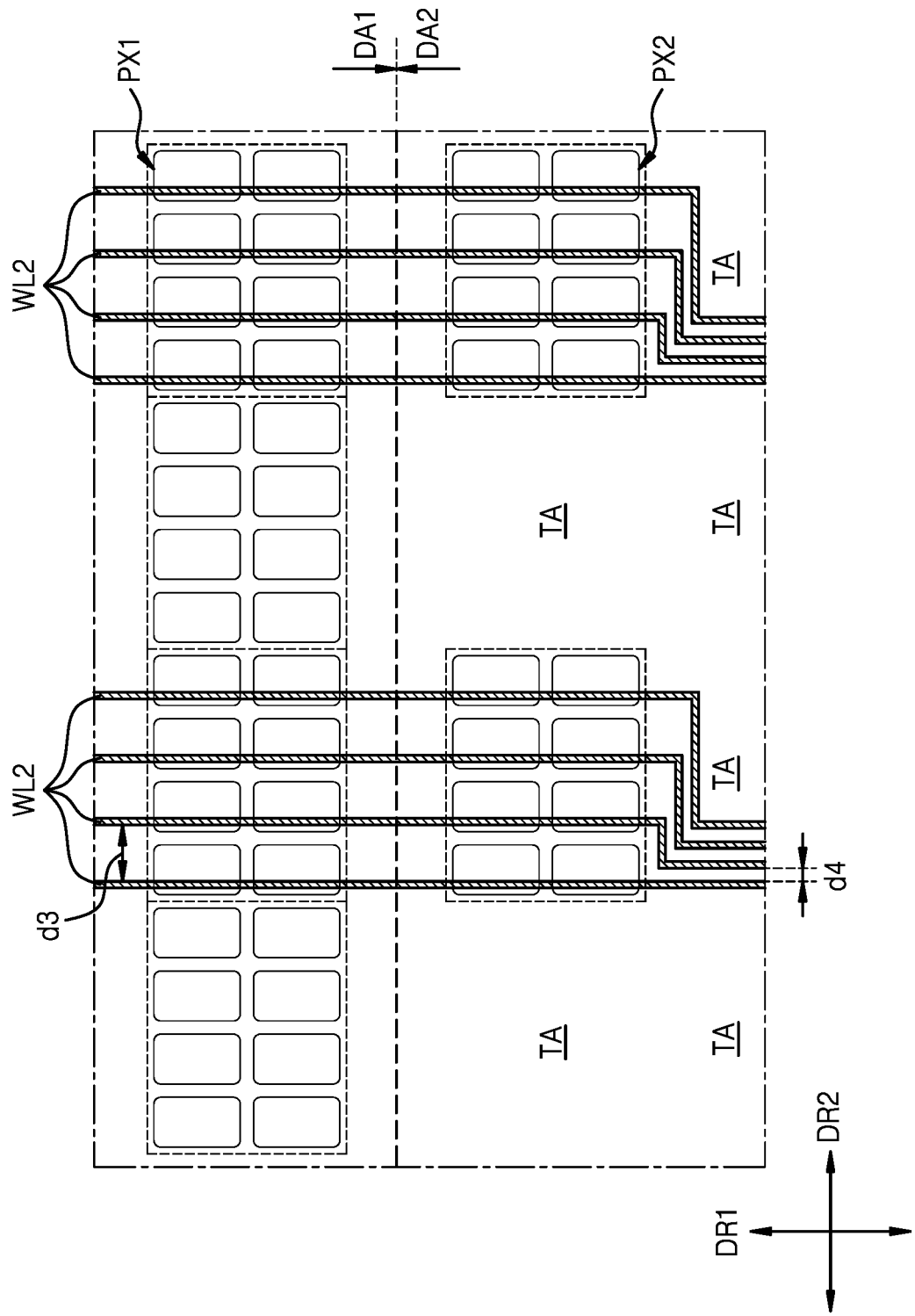
Figure 6C:
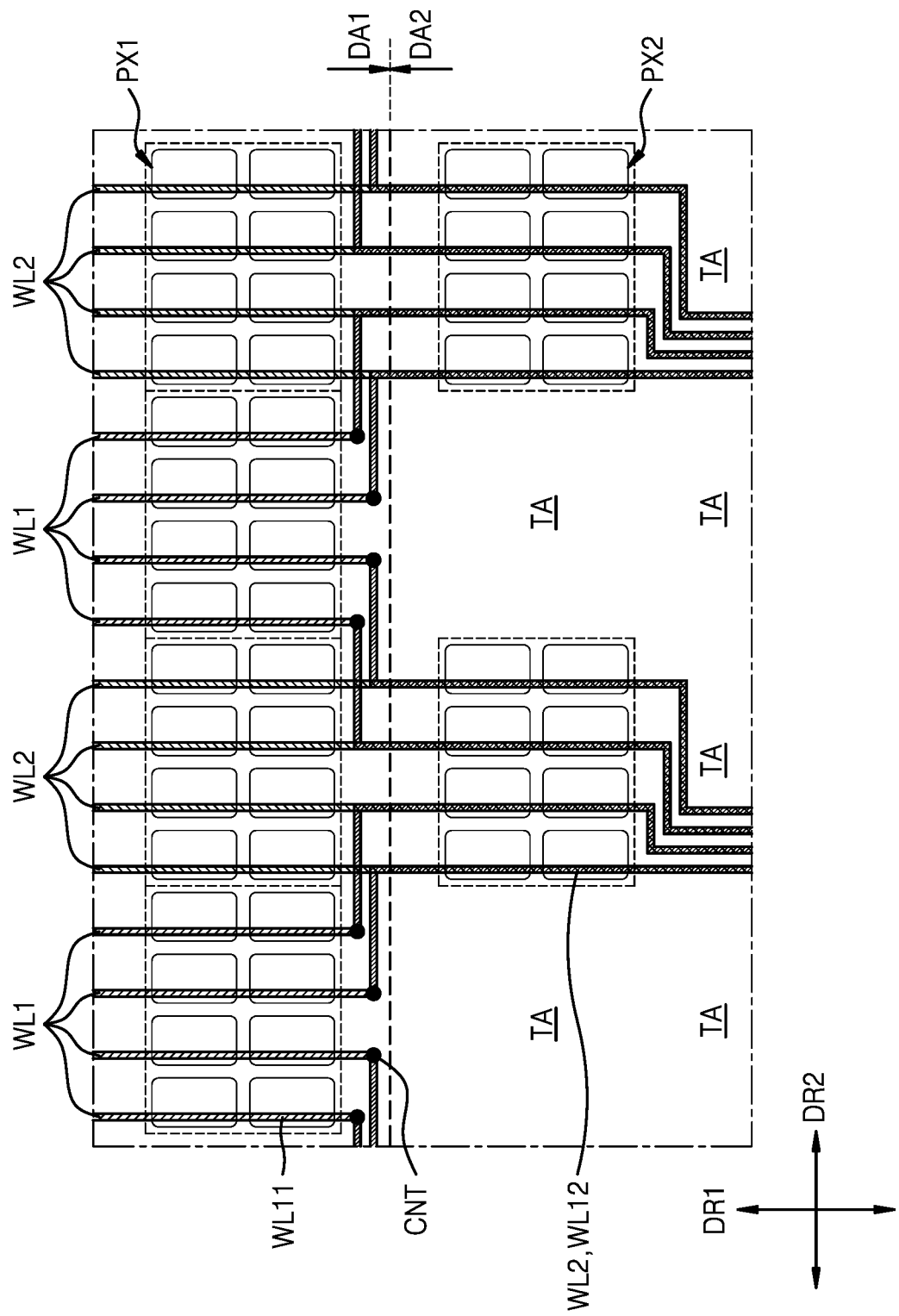
Figure 6D:
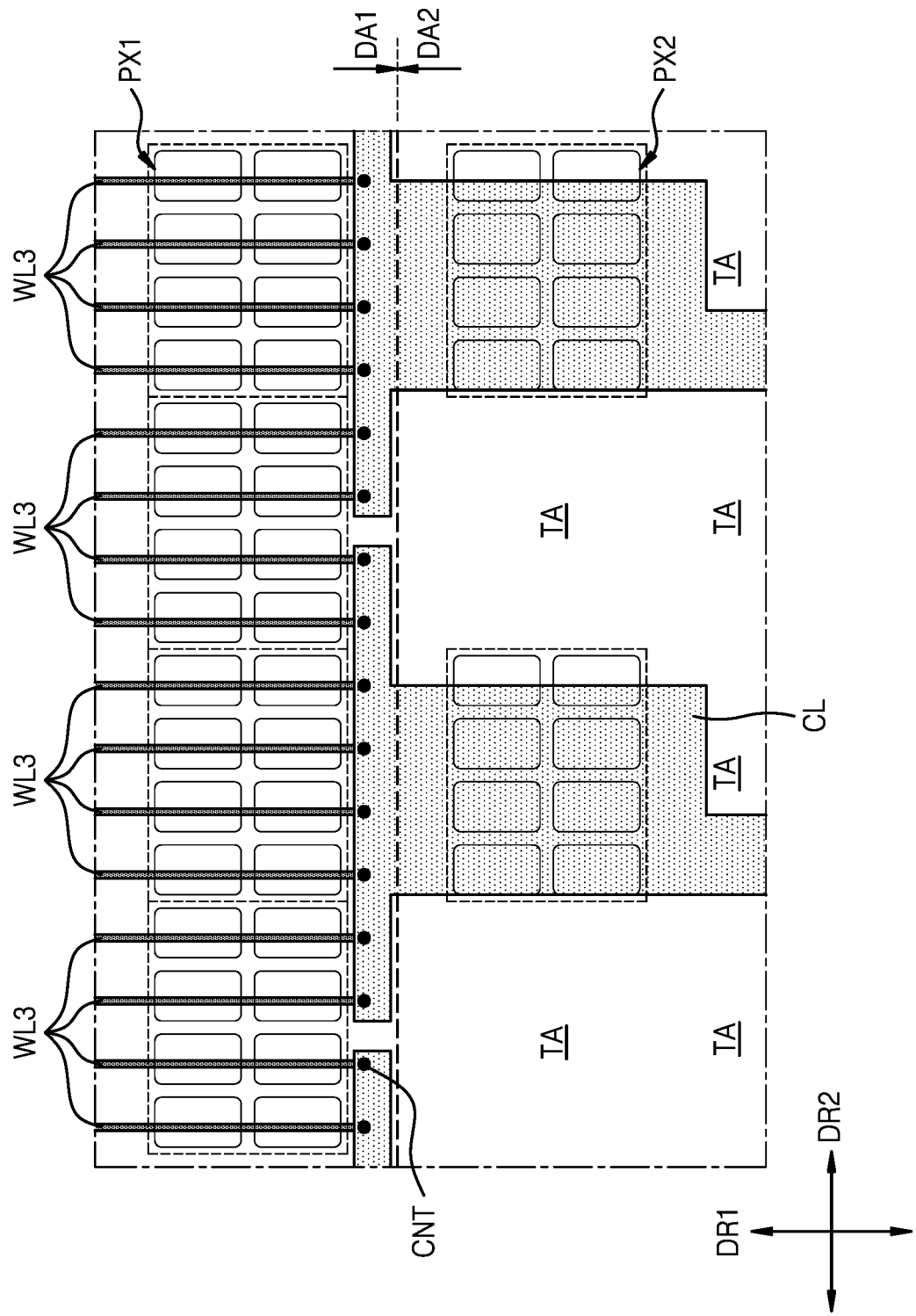
Figure 6E:
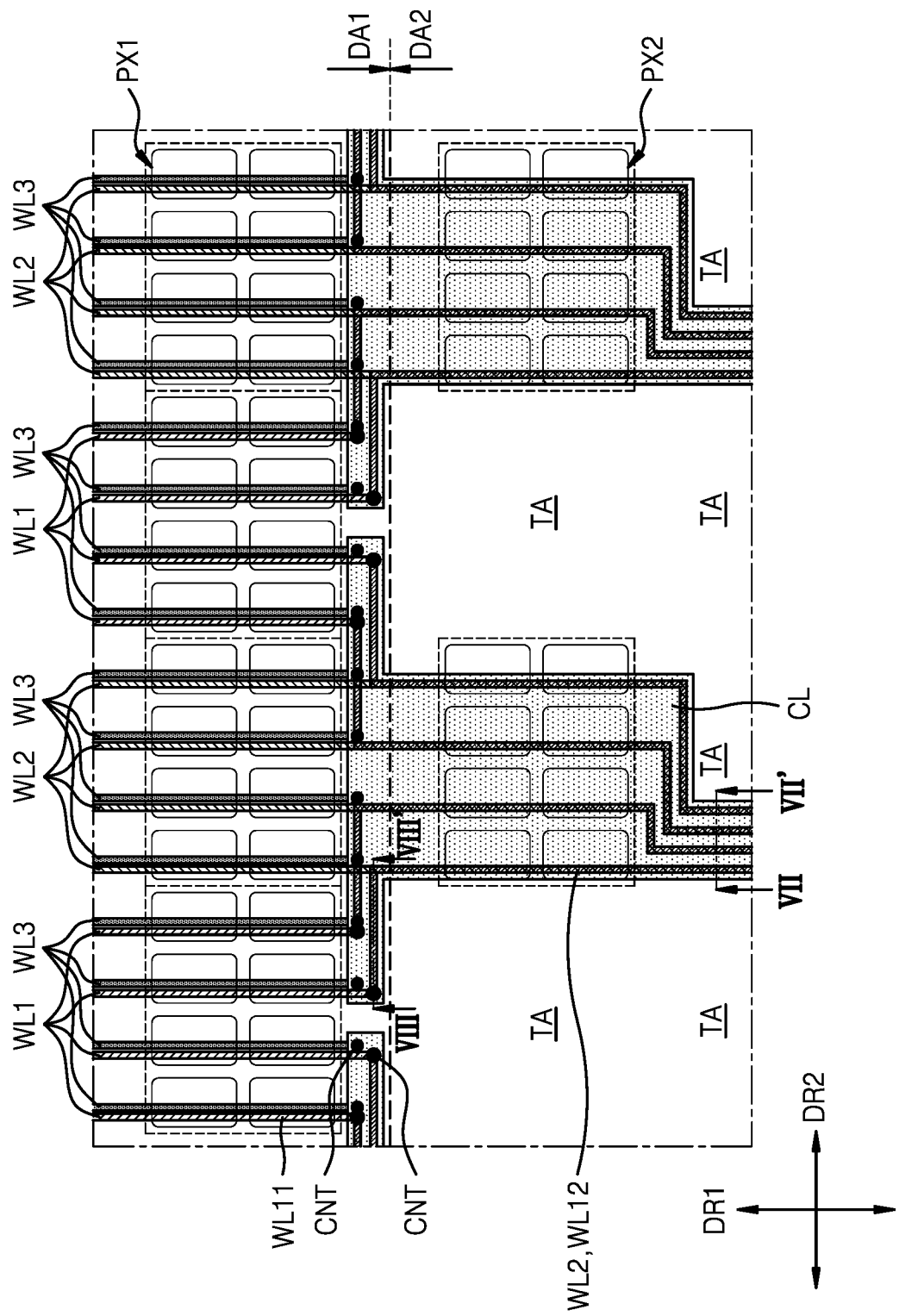

7B is a cross-sectional view of another exemplary embodiment taken along line VII-VII' of FIG. 6E.

Figure 8:
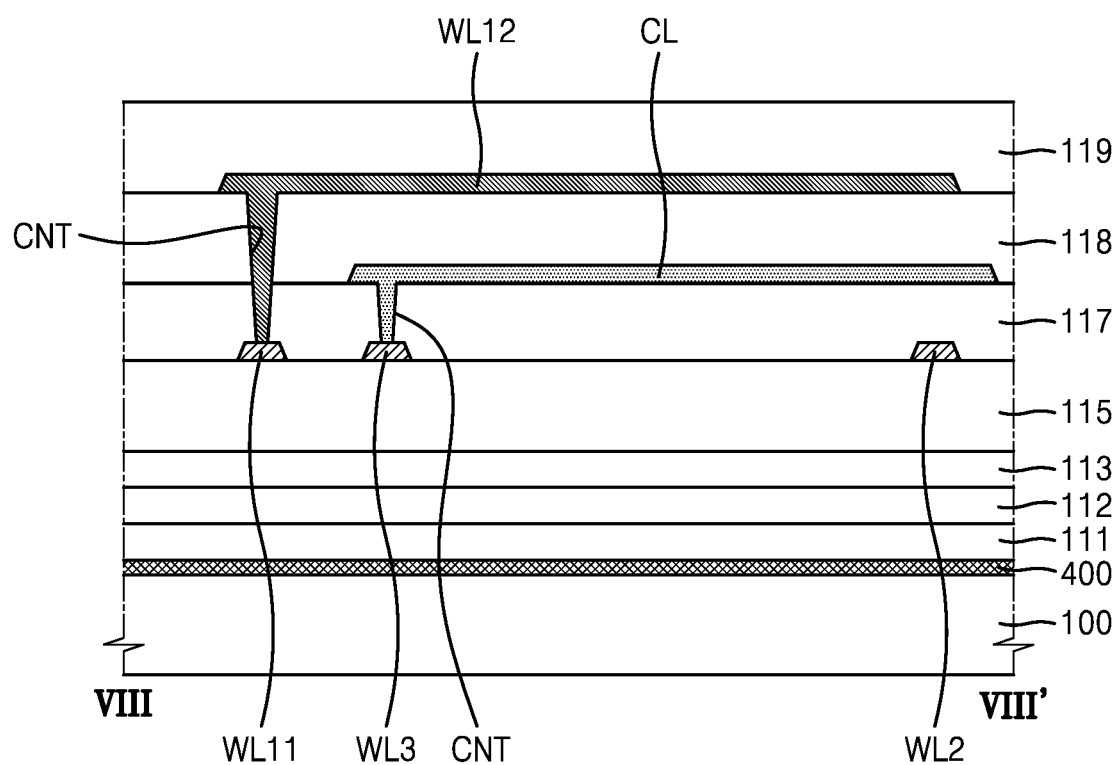

FIG. 8 is a cross-sectional view taken along line VIII-VIII' of FIG. 6E.

DETAILED DESCRIPTION

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath"

other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1:
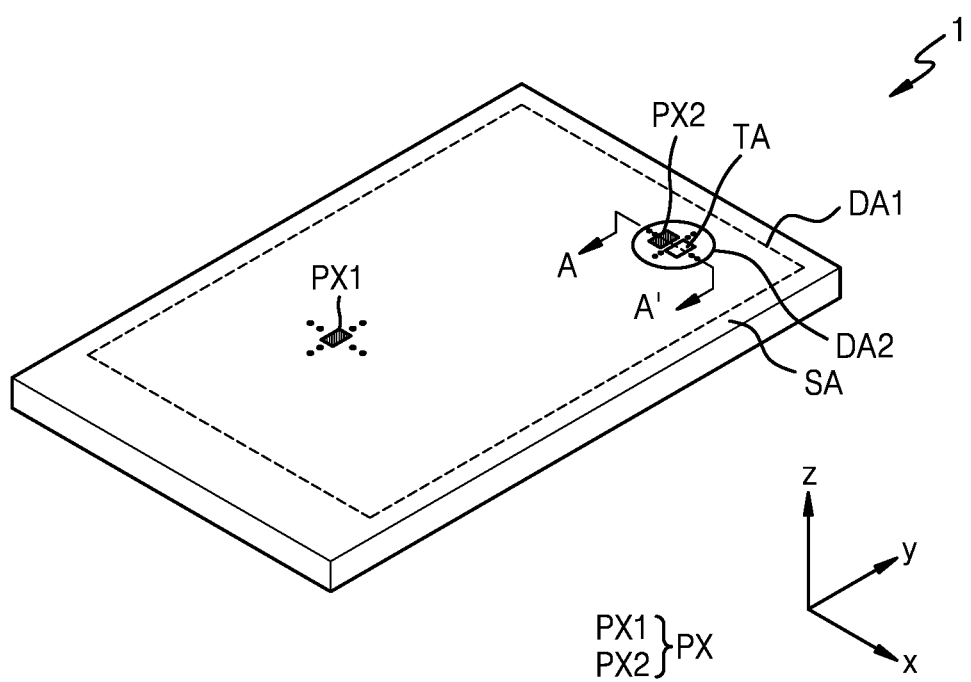
FIG. 1 is a schematic perspective view of an exemplary embodiment of an electronic device constructed according to FIG. 2 is a schematic cross-sectional view taken along line A-A' in FIG. 1.

FIG. 1 is a schematic perspective view of an exemplary embodiment of an electronic device 1 constructed according to the principles of the invention.

Referring to FIG. 1, the electronic device 1 includes a first display area DA1, a second display area DA2 surrounded by the first display area DA1, and a peripheral area SA outside the first display area DA1.

FIG. 1 illustrates that one second display area DA2 is arranged inside the first display area DA1. In another exemplary embodiment, the number of second display areas DA2 may be two or more, and shapes and sizes of the second display areas DA2 provided in plural may be different from each other. The peripheral area SA may be a type of non-display area in which pixels are not arranged. The first display area DA1 may be entirely or partially surrounded by the peripheral area SA.

Although FIG. 1 illustrates that the second display area DA2 is substantially circular, exemplary embodiments are not limited thereto. In a plane view (or when viewed in a direction perpendicular to one surface of a substrate), the second display area DA2 may have one of various shapes such as a circle, an ellipse, a polygon such as a quadrangle, a star shape, and a diamond shape.

In addition, although FIG. 1 illustrates that the second display area DA2 is arranged on one side (upper right side) of the first display DA1 having a quadrangular shape, exemplary embodiments are not limited thereto. In another exemplary embodiment, the second display area DA2 may be arranged on the upper left side or upper center of the first display area DA1 having a quadrangular shape.

Hereinafter, although an electronic device including an organic light-emitting display device will now be illustrated and described as the electronic device 1, the electronic device 1 is not limited thereto. In another exemplary embodiment, the electronic device 1 may include a display panel such as an inorganic light-emitting display panel or a quantum dot light-emitting display panel. For example, an emission layer of a display element in a display panel may include an organic material, include an inorganic material, include a quantum dot, include an organic material and a quantum dot, or include an inorganic material and a quantum dot.

The electronic device 1 may provide a certain image by using light emitted from a display element included in each of a plurality of pixels arranged in the first display area DA1 and the second display area DA2. A first pixel array in which a plurality of first pixels PX1 are two-dimensionally arranged may be located in the first display area DA1, and a second pixel array in which a plurality of second pixels PX2 are two-dimensionally arranged may be located in the second display area DA2.

The electronic device 1 may provide a first image (or a main image) by using light emitted from a display element included in each of the plurality of first pixels PX1 arranged in the first display area DA1. In addition, the electronic device 1 may provide a second image (or an auxiliary image) by using light emitted from a display element included in each of the plurality of second pixels PX2 arranged in the second display area DA2. The first image and the second image may respectively correspond to portions of one image or may be independent images. The second image provided from the second display area DA2 may have a lower resolution than the first image provided from the first display area DA1.

Figure 2:
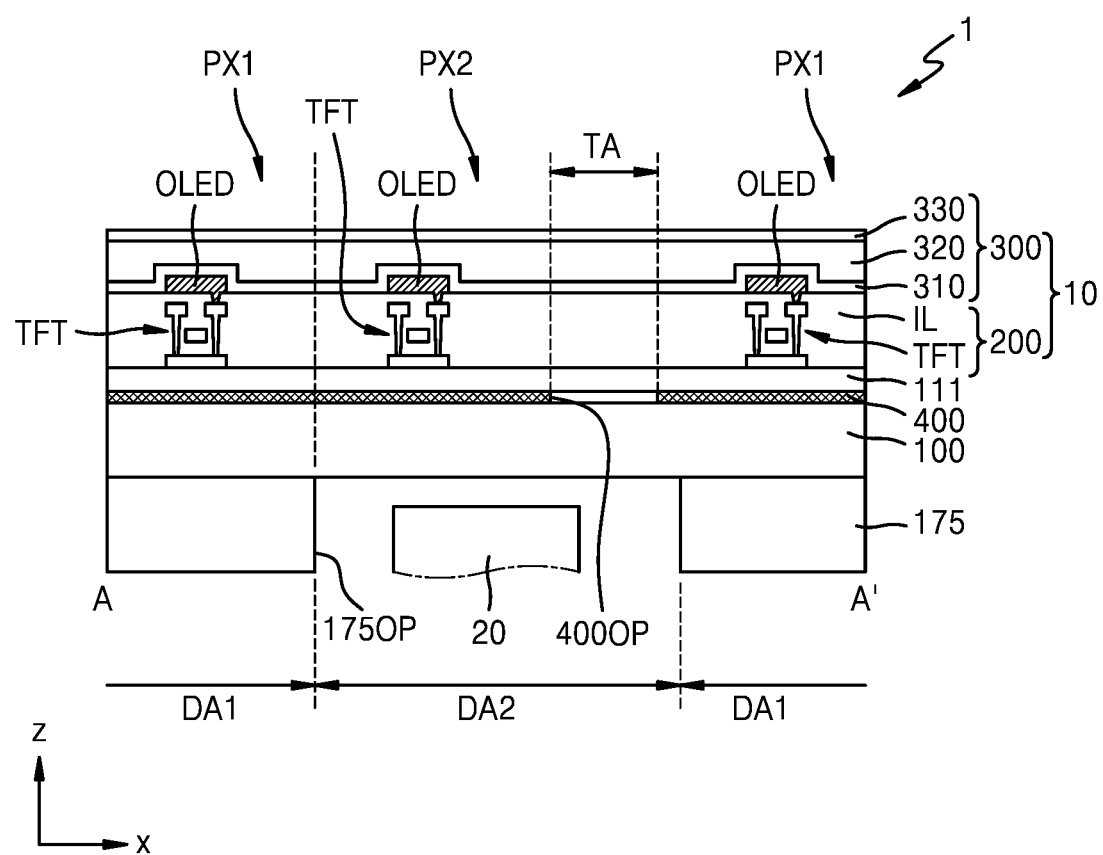

The electronic device 1 may include an electronic component 20 of FIG. 2 located in the second display area DA2, and the second display area DA2 may include a transmissive portion TA to drive the electronic component.

FIG. 2 is a schematic cross-sectional view of the electronic device 1 of FIG. 1. FIG. 2 corresponds to a cross-section of the electronic device 1 taken along line A-A' of FIG. 1.

Referring to FIG. 2, the electronic device 1 may include a display panel 10 including a display element and an electronic component 20 located under the display panel 10 and corresponding to the second display area DA2.

The display panel 10 may include a substrate 100, a buffer layer 111 arranged on the substrate 100, a display element layer 200 arranged on the buffer layer 111, and a thin-film encapsulation layer 300 being a sealing member that seals the display element layer 200. The display panel 10 may further include a light-blocking layer 400 on the substrate 100 or between multi-layered structures of the substrate 100. Also, the display panel 10 may further include a lower protective layer 175 arranged under the substrate 100.

The substrate 100 may include glass or a polymer resin. In an exemplary embodiment, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multi-layered structure including a layer including the above-described polymer resin and an inorganic layer (not shown).

The display element layer 200 may include a circuit layer including a thin-film transistor TFT, an organic light-emitting diode OLED as a display element, and an insulating layer IL therebetween.

A first pixel PX1, which includes a pixel circuit including a thin-film transistor TFT and an organic light-emitting diode OLED related to the pixel circuit, is arranged in the first display area DA1. In addition, wiring lines (not shown) electrically connected to first pixels PX1 may be arranged in the first display area DA1.

A second pixel PX2, which includes a pixel circuit including a thin-film transistor TFT and an organic light-emitting diode OLED related to the pixel circuit, is arranged in the second display area DA2. In addition, wiring lines (not shown) electrically connected to first pixels PX1 and second pixels PX2 may be arranged in the second display area DA2.

A transmissive portion TA may be arranged in the second display area DA2. The transmissive portion TA is a region in which the second pixels PX2 and wiring lines connected to the second pixels PX2 are not arranged, and light or a signal may pass through the transmissive portion TA. The transmissive portion TA corresponds to a region through which light/signals emitted from the electronic component 20 or light/signals incident on the electronic component 20 are transmitted.

The thin-film encapsulation layer 300 may include at least one inorganic encapsulation layer and at least one organic encapsulation layer. In this regard, FIG. 2 shows first and second inorganic encapsulation layers 310 and 330 and an organic encapsulation layer 320 therebetween.

Each of the first and second inorganic encapsulation layers 310 and 330 may include one or more inorganic insulating materials selected from aluminum oxide, titanium oxide, tantalum oxide, hafnium oxide, zinc oxide, silicon oxide, silicon nitride, and silicon oxynitride. The organic encapsulation layer 320 may include a polymer-based material. For example, the polymer-based material may include polyethylene terephthalate, polyethylene naphthalate, polycarbonate, polyimide, polyethylene sulfonate, polyoxymethylene, polyarylate, hexamethyldisiloxane, acryl-based resin (e.g., polymethyl methacrylate or polyacryl acid), or a combination thereof.

The light-blocking layer 400 may be between the substrate 100 and the display element layer 200. For example, the light-blocking layer 400 may be arranged under the pixel PX, for example, between the thin-film transistor TFT of the second pixel PX2 and the substrate 100.

The light-blocking layer 400 may include an opening 4000P corresponding to the transmissive portion TA. The light-blocking layer 400 may include a portion that defines the opening 4000P and includes a light-blocking material (e.g., metal or black ink) provided in the light-blocking layer 400. The portion of the light-blocking layer 400 may be arranged to cover the first pixel PX1 of the first display area DA1 and the second pixel PX2 of the second display area DA2. A portion covering the first pixel PX1 of the first display area DA1 and a portion covering the second pixel PX2 of the second display area DA2 may be connected to each other as one body. For example, the light-blocking layer 400 may be arranged to correspond to the first display area DA1 of the display panel 10, and the entire area of the second display area DA2 excluding the transmissive portion TA. In another exemplary embodiment, the light-blocking layer 400 may be arranged, in an island shape, under the pixels PX, for example, under the thin-film transistors TFT of the first pixels PX1 and/or the second pixels PX2.

The light-blocking layer 400 may be arranged on the substrate 100, as shown in FIG. 2. Alternatively, the light-blocking layer 400 may be between multi-layered structures of the substrate 100. For example, the light-blocking layer 400 may be between a plurality of sub-layers constituting the substrate 100.

When the electronic component 20 includes a sensor that emits a certain light, the light-blocking layer 400 may block light emitted from the electronic component 20 from being incident on a pixel circuit (e.g., a pixel circuit PC of FIG. 3) of the second pixel PX2.

The light-blocking layer 400 may be connected to a gate electrode, a source electrode, or a drain electrode in the thin-film transistor TFT. Alternatively, the light-blocking layer 400 may be connected to a driving voltage line PL providing a power voltage to the pixel PX.

The light-blocking layer 400 may include a conductive material such as metal, and a constant voltage or a signal may be applied to the light-blocking layer 400 to prevent damage to the pixel circuit PC due to electrostatic discharge. A plurality of light-blocking layers 400 may be provided in the second display area DA2, and in some cases, the plurality of light-blocking layers 400 may receive different voltages.

The light-blocking layer 400 may include a metal such as chromium, or a metal oxide such as chromium oxide. In this case, the light-blocking layer 400 may be formed to have a single layer or multiple layers by using sputtering or E-beam evaporation. According to another exemplary embodiment, the light-blocking layer 400 may include a light-absorbing material. In this case, the light-blocking layer 400 may at least partially absorb external light. The light-absorbing material may include carbon black or an organic insulating material.

The lower protective layer 175 may be attached to the bottom of the substrate 100 to support and protect the substrate 100. The lower protective layer 175 may have an opening 175OP corresponding to the second display area DA2. As the lower protective layer 175 has the opening 175OP, the light transmittance of the second display area DA2 may be improved. The lower protective layer 175 may include polyethylene terephthalide (PET) or polyimide (PI).

The electronic component 20 may be located in the second display area DA2. The electronic component 20 may be an electronic element using light. For example, the electronic component 20 may be an imaging device such as a camera, a sensor that receives and uses light, like an infrared sensor, a sensor that outputs and senses light to measure a distance or recognizes a fingerprint, or a small lamp that outputs light. When the electronic component 20 is an electronic element using light, the electronic component 20 may use light in various wavelength bands, such as visible light, infrared light, and ultraviolet light.

Light output from the electronic component 20 or/and directed to the electronic component 20 may pass through the transmissive portion TA. In an exemplary embodiment, when infrared light is transmitted through the second display area DA2, a light transmittance in the second display area DA2 may be about 50% or greater, 60% or greater, 70% or greater, 85% or greater, or 90% or greater.

The electronic component 20 arranged in the second display area DA2 may include one or more components. For example, the electronic component 20 may include a light-emitting element and a light-receiving element, which are arranged adjacent to each other. Alternatively, one electronic component 20 may have both the function of a light-emitting portion and the function of a light-receiving portion.

The area of the second display area DA2 may be greater than an area in which the electronic component 20 is arranged. In FIG. 2, it is shown that the area of the second display area DA2 and the area of the opening 175OP of the lower protective layer 175 are equal to each other. However, the area of the opening 175OP of the lower protective layer 175 may not be equal to the area of the second display area DA2. For example, the area of the opening 175OP of the lower protective layer 175 may be less than the area of the second display area DA2.

Although not shown in the drawings, a component(s), such as an input sensing member for sensing a touch input, an anti-reflection member including a polarizer and a retarder, or a color filter and a black matrix, and a transparent window, may be arranged on the display panel 10.

In the illustrated exemplary embodiment, the thin-film encapsulation layer 300 is used as an encapsulation member that seals the display element layer 200. However, exemplary embodiments are not limited thereto. For example, an encapsulation substrate (e.g., a glass substrate) coupled with the substrate 100 by a sealant or frit may be used as a member that seals the display element layer 200.

Figure 3:
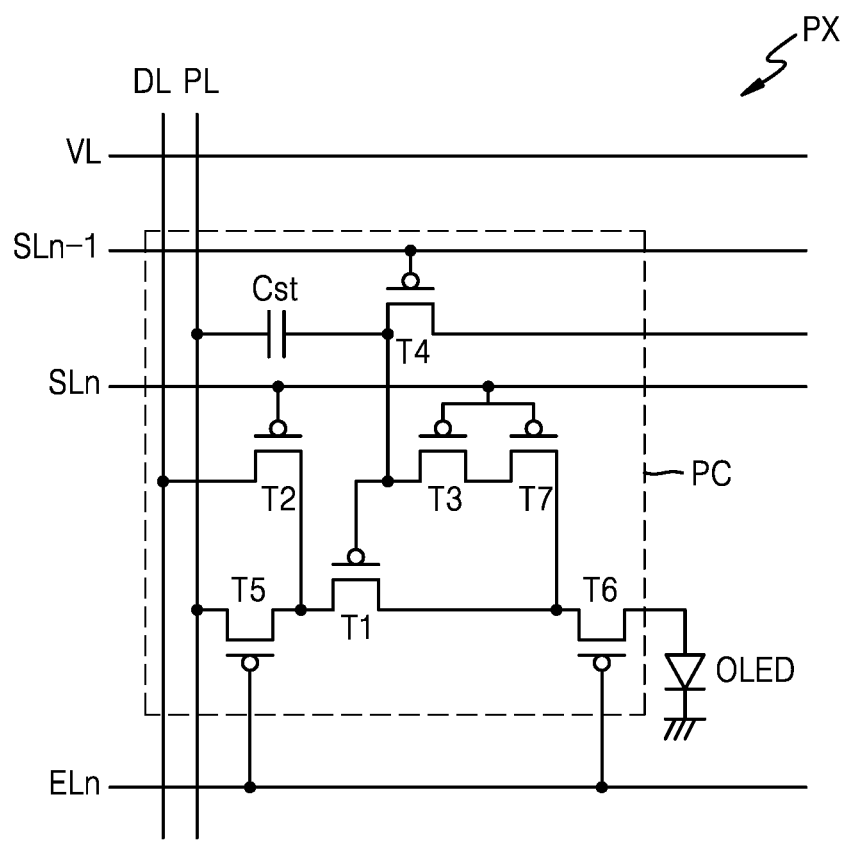
FIG. 3 is an equivalent circuit diagram of an exemplary embodiment of a pixel included in the display panel of FIG. 2.

FIG. 3 is an equivalent circuit diagram of an exemplary embodiment of a pixel PX included in the display panel 10 of FIG. 2.

Referring to FIG. 3, one pixel PX includes a pixel circuit PC including a plurality of thin-film transistors T1 to T7 and a storage capacitor Cst. The pixel PX further include an organic light-emitting diode OLED that receives a driving voltage through the pixel circuit PC and emits light. The pixel PX in FIG. 3 corresponds to the first pixel PX1 and/or the second pixel PX2 described above with reference to FIGS. 1 and 2.

The plurality of thin-film transistors T1 to T7 may include a driving thin-film transistor T1, a switching thin-film transistor T2, first and second compensation thin-film transistors T3 and T7, an initialization thin-film transistor T4, an operation control thin-film transistor T5, and an emission control thin-film transistor T6.

The pixel circuit PC includes a first scan line SLn that transmits a first scan signal to the switching thin-film transistor T2 and the first and second compensation thin-film transistors T3 and T7, a second scan line SLn−1 that transmits a second scan signal, which is a previous scan signal, to the initialization thin-film transistor T4, an emission control line ELn that transmits an emission control signal to the operation control thin-film transistor T5 and the emission control thin-film transistor T6, a data line DL that crosses the first scan line SLn and transmits a data signal, a driving voltage line PL that transmits a first power voltage and is formed substantially parallel to the data line DL, and an initialization voltage line VL that transmits an initialization voltage for initializing the driving thin-film transistor T1 and is formed substantially parallel to the second scan line SLn−1.

Each of the plurality of thin-film transistors T1 to T7 includes at least one gate electrode, a source electrode, and a drain electrode. The driving thin-film transistor T1 is configured to receive a data signal according to a switching operation of the switching thin-film transistor T2 and supply a driving current to the organic light-emitting diode OLED.

The switching thin-film transistor T2 is configured to be turned on according to the first scan signal received through the first scan line SLn and transmit the data signal transmitted to the data line DL to the source electrode of the driving thin-film transistor T1.

The first compensation thin-film transistor T3 and the second compensation thin-film transistor T7 have a double gate structure, and the gate electrodes of the first and second compensation thin-film transistors T3 and T7 are connected to the first scan line SLn. The first and second compensation thin-film transistors T3 and T7 are configured to be turned on according to the first scan signal received through the first scan line SLn and connect the gate electrode and the drain electrode of the driving thin-film transistor T1 to each other such that the driving thin-film transistor T1 is diode-connected.

The initialization thin-film transistor T4 is configured to be turned on according to the second scan signal received through the second scan line SLn−1 and transmit the initialization voltage to the gate electrode of the driving thin-film transistor T1 to thereby initialize a voltage of the gate electrode of the driving thin-film transistor T1.

The operation control thin-film transistor T5 is configured to be turned on according to the emission control signal received through the emission control line ELn and transmit the driving voltage to the driving thin-film transistor T1.

The operation control thin-film transistor T5 and the emission control thin-film transistor T6 are turned on at the same time according to the emission control signal received through the emission control line ELn, and thus, the first power voltage is transmitted to the organic light-emitting diode OLED and a driving current flows through the organic light-emitting diode OLED.

One electrode of the storage capacitor Cst is connected to the driving voltage line PL. The other electrode of the storage capacitor Cst is connected to the gate electrode of the driving thin-film transistor T1, the drain electrode of the first compensation thin-film transistor T3, and the drain electrode of the initialization thin-film transistor T4.

The cathode electrode of the organic light-emitting diode OLED is connected to a second power voltage. The organic light-emitting diode OLED displays an image by receiving a driving current from the driving thin-film transistor T1 and emitting light. The first power voltage may be a certain high level voltage, and the second power voltage may be a voltage, which is less than the first power voltage, or a ground voltage.

The case where the pixel circuit PC includes seven thin-film transistors T1 to T7 and one storage capacitor Cst has been described, but exemplary embodiments are not limited thereto.

Figure 4A:
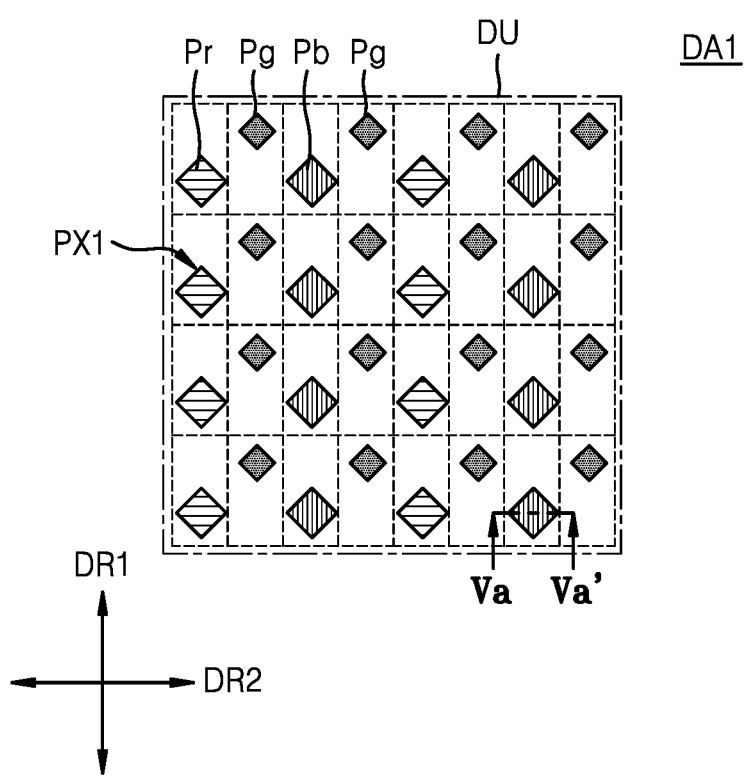
FIGS. 4A and 4B are schematic plan views of exemplary embodiments of pixel arrangement structures constructed according to the principles of the invention.
Figure 4B:
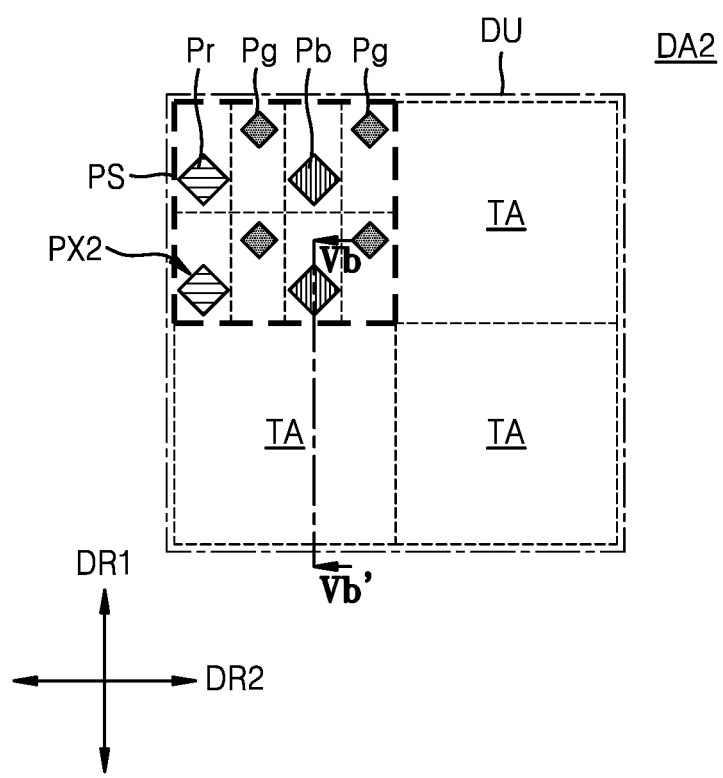

FIGS. 4A and 4B are schematic plan views of exemplary embodiments of pixel arrangement structures including emission areas constructed according to the principles of the invention. FIG. 4A shows an emission area in the first display area DA1, and FIG. 4B shows an emission area in the second display area DA2.

Referring to FIG. 4A, first pixels PX1 are arranged in the first display area DA1, and each of the first pixels PX1 emits light through an organic light-emitting diode. In this regard, FIG. 4A illustrates a plurality of the first pixels PX1 including a red emission area Pr, a green emission area Pg, and a blue emission area Pb, respectively, which are arranged in the first display area DA1.

In FIG. 4A, the red emission area Pr, the green emission area Pg, and the blue emission area Pb are arranged in a pentile type. However, the red emission area Pr, the green emission area Pg, and the blue emission area Pb may be arranged in various shapes such as a stripe type.

Referring to FIG. 4B, second pixels PX2 are arranged in the second display area DA2, and each of the second pixels PX2 emits light through an organic light-emitting diode. In this regard, FIG. 4B illustrates a plurality of the second pixels PX2 including a red emission area Pr, a green emission area Pg, and a blue emission area Pb, respectively, which are arranged in the second display area DA2.

The second display area DA2 may include display units DU that are repeatedly arranged. In this case, a transmissive portion TA may be located between the second pixels PX2.

For example, the transmissive portion TA may be located between pixel sets PS including the second pixels PX2. Each of the pixel sets PS may be defined as a pixel assembly in which a plurality of second pixels PX2 are grouped in a preset unit. In FIG. 4B, the pixel set PS is defined as including eight second pixels PX2. However, exemplary embodiments are not limited thereto. The number of second pixels PX2 included in the pixel set PS may be changed according to the resolution of the second display area DA2.

Referring to FIGS. 4A and 4B, per equal area, the number of first pixels PX1 in the first display area DA1 may be greater than the number of second pixels PX2 in the second display area DA2. For example, the number of first pixels PX1 per display unit DU of the first display area DA1 may be greater than the number of second pixels PX2 per display unit DU of the second display area DA2. The display unit DU of the first display area DA1 and the display unit DU of the second display area DA2 may have the same area.

In FIG. 4B, a display unit DU, which includes one pixel set PS and three transmissive portions TA arranged in an L-shape around the pixel set PS, is illustrated. However, the display unit DU may be formed such that transmissive portions TA entirely surround a plurality of pixel sets PS adjacent to each other. In addition, the display unit DU may be formed such that a plurality of transmissive portions TA and a plurality of pixel sets PS are alternately arranged in a lattice form.

In FIG. 4B, a red emission area Pr, a green emission area Pg, and a blue emission area Pb are arranged in a pentile type. However, the red emission area Pr, the green emission area Pg, and the blue emission area Pb may be arranged in various shapes such as a stripe type.

The second pixel PX2 may not be arranged in the transmissive portion TA. That the second pixel PX2 is not arranged in the transmissive portion TA may mean that the organic light-emitting diode and the pixel circuit of the second pixel PX2 are not arranged in the transmissive portion TA. Signal lines PL, VL, DL, SLn, SLn−1, and ELn (see FIG. 3) for supplying signals to the second pixel PX2 may not be arranged in the transmissive portion TA.

In order to increase the area of the transmissive portion TA, the signal lines PL, VL, DL, SLn, SLn−1, and ELn may be densely arranged in an area adjacent to the transmissive portion TA. The arrangement of wiring lines (e.g., signal lines) around the transmissive portion TA will be described below with reference to FIGS. 6 to 8.

Figure 5A:
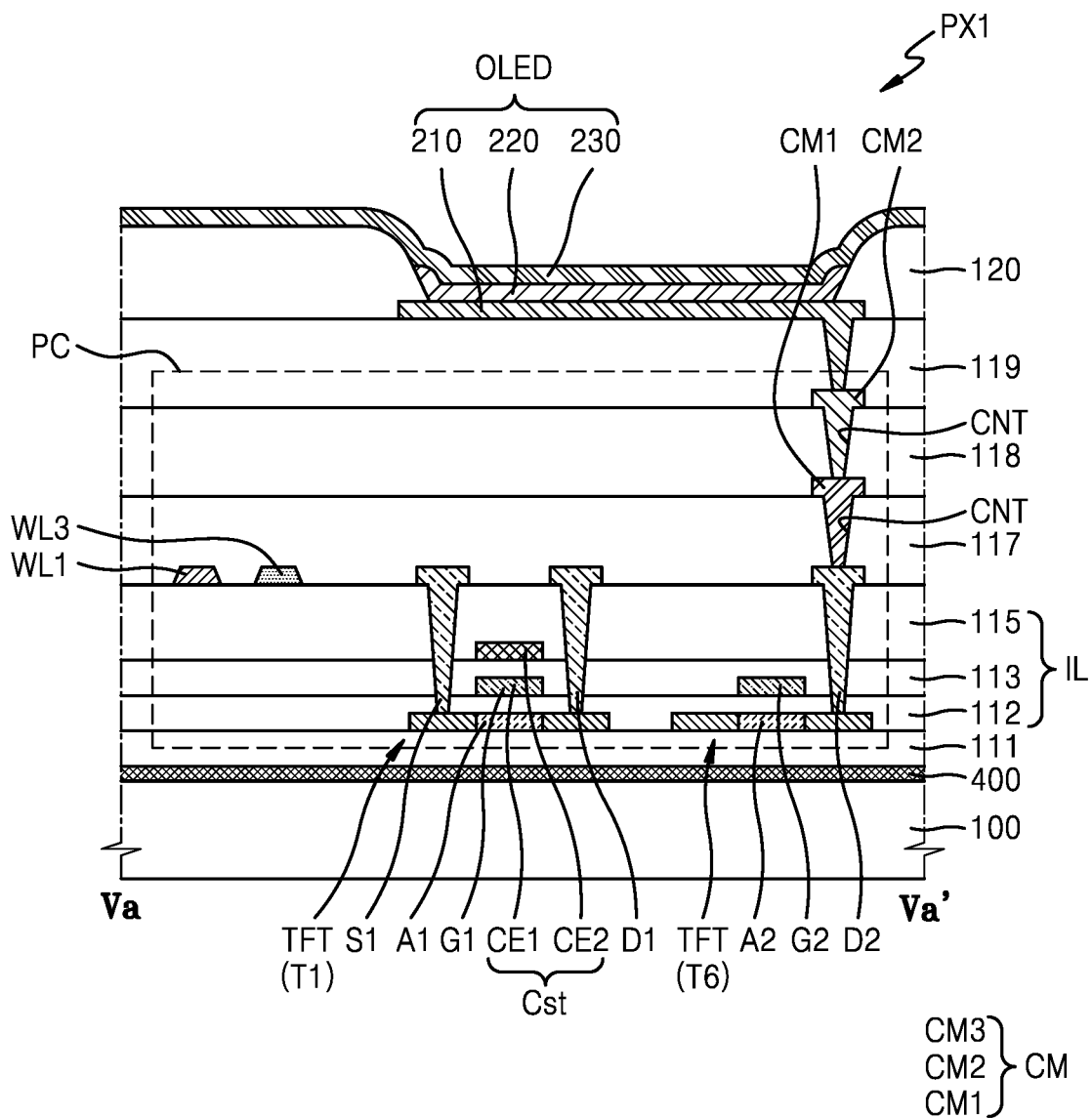
FIG. 5A is a schematic cross-sectional view taken along line Va-Va' in FIG. 4A.

FIG. 5A is a schematic cross-sectional view of the first pixel PX1 of FIG. 4A. FIG. 5A correspondS to a cross-section of the first pixel PX1 taken along line Va-Va' of FIG. 4A.

Referring to FIG. 5A, a pixel circuit PC may be arranged on a substrate 100 and an organic light-emitting diode OLED may be arranged on the pixel circuit PC.

The pixel circuit PC may include a plurality of thin-film transistors T1 to T7 and a storage capacitor Cst, as described above with reference to FIG. 3. In this regard, FIG. 5A shows a driving thin-film transistor T1 and an emission control thin-film transistor T6.

A buffer layer 111 is arranged on the substrate 100, and thin-film transistors TFT of the first pixel PX1, for example, the driving thin-film transistor T1 and the emission control thin-film transistor T6, are arranged on the buffer layer 111.

The driving thin-film transistor T1 may include a first semiconductor layer A1, a first gate electrode G1, and a first source electrode Si, and a first drain electrode D1, and the emission control thin-film transistor T6 may include a second semiconductor layer A2, a second gate electrode G2, a second source electrode (not shown), and a second drain electrode D2. The emission control thin-film transistor T6 may be connected to the organic light-emitting diode OLED to drive the organic light-emitting diode OLED.

The first semiconductor layer A1 and the second semiconductor layer A2 may be arranged on the buffer layer 111 and may each include polysilicon. In another exemplary embodiment, the first semiconductor layer A1 and the second semiconductor layer A2 may each include amorphous silicon. In another exemplary embodiment, the first semiconductor layer A1 and the second semiconductor layer A2 may each include oxide of at least one material selected from indium (In), gallium (Ga), stannium (Sn), zirconium (Zr), vanadium (V), hafnium (Hf), Cadmium (Cd), germanium (Ge), chromium (Cr), titanium (T1), and zinc (Zn). The first semiconductor layer A1 and the second semiconductor layer A2 may each include a channel area, and a source area and a drain area doped with impurities.

A first gate insulating layer 112 may be provided on the first and second semiconductor layers A1 and A2. The first gate insulating layer 112 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first gate insulating layer 112 may include a single layer or multiple layers including the above-described inorganic insulating material.

A first gate electrode G1 and a second gate electrode G2 are arranged on the first gate insulating layer 112 to overlap the first semiconductor layer A1 and the second semiconductor layer A2, respectively. The first gate electrode G1 and the second gate electrode G2 may each include molybdenum (Mo), aluminum (Al), copper (Cu), titanium (T1), or the like and include a single layer or multiple layers. For example, the first gate electrode G1 and the second gate electrode G2 may each include a single layer including Mo.

A second gate insulating layer 113 may be provided on the first gate electrode G1 and the second gate electrode G2. The second gate insulating layer 113 may include an inorganic insulating material such as $SiO_x$, $SiN_x$, SiON, $Al_2O_3$, $TiO_2$, $Ta_2O_5$, $HfO_2$, or $ZnO_2$. The second gate insulating layer 113 may include a single layer or multiple layers including the above-described inorganic insulating material.

An upper electrode CE2 of the storage capacitor Cst may be arranged on the second gate insulating layer 113. In the first display area DA1, the upper electrode CE2 may overlap the first gate electrode G1 thereunder. The first gate electrode G1 and the upper electrode CE2 overlapping each other with the second gate insulating layer 113 therebetween may form the storage capacitor Cst. The first gate electrode G1 may be a lower electrode CE1 of the storage capacitor Cst.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (T1), tungsten (W), and/or copper (Cu) and may include a single layer or multiple layers including the above-described material.

An interlayer insulating layer 115 may be formed to cover the upper electrode CE2. The interlayer insulating layer 115 may include $SiO_x$, $SiN_x$, SiON, $Al_2O_3$, $TiO_2$, $Ta_2O_5$, $HfO_2$, $ZnO_2$, or the like.

The first source electrode S 1 and the first and second drain electrodes D1 and D2 are arranged on the interlayer insulating layer 115. The first source electrode S 1 and the first and second drain electrodes D1 and D2 may each include a conductive material including Mo, Al, Cu, Ti, or the like and may each include a single layer or multiple layers including the conductive material. For example, the first source electrode S1 and the first and second drain electrodes D1 and D2 may each have a multi-layered structure of Ti/Al/Ti.

First and third wiring lines WL1 and WL3 may be arranged on the same layer as the first source electrode S1 and the first and second drain electrodes D1 and D2. The first wiring line WL1 may include a data line, and the third wiring line WL3 may include a driving voltage line.

A first insulating layer 117 may be arranged on the first source electrode S1 and the first and second drain electrodes D1 and D2. A second insulating layer 118 may be arranged on the first insulating layer 117. A third insulating layer 119 may be arranged on the second insulating layer 118. The first to third insulating layers 117, 118, and 119 may be first to third planarization layers, respectively, and may each have a flat top surface such that a pixel electrode 210 arranged thereon is formed flat.

Each of the first to third insulating layers 117, 118, and 119 may include a single layer or multiple layers including an organic material or an inorganic material. Each of the first to third insulating layers 117, 118, and 119 may include an organic insulating material. Each of the first to third insulating layers 117, 118, and 119 may include a commercial polymer such as benzocyclobutene (BCB), polyimide, hexamethyldisiloxane (HMDSO), polymethyl methacrylate (PMMA) or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like. Each of the first to third insulating layers 117, 118, and 119 may include $SiO_x$, $SiN_x$, SiON, $Al_2O_3$, $TiO_2$, $Ta_2O_5$, $HfO_2$, $ZnO_2$, or the like. After the first to third insulating layers 117, 118, and 119 are formed, chemical mechanical polishing may be performed to provide a flat top surface thereof.

The interlayer insulating layer 115 and the first to third insulating layers 117, 118, and 119 may have a contact hole CNT that exposes one of the second source electrode (not shown) and the second drain electrode D2 of the emission control thin-film transistor T6. A contact metal portion CM may be located in the contact hole CNT. That is, a first contact metal portion CM1 may be located in a contact hole formed in the first insulating layer 117, and a second contact metal portion CM2 may be located in a contact hole formed in the second insulating layer 118.

The pixel electrode 210 may contact the second source electrode (not shown) or the second drain electrode D2 through the contact metal portion CM, and thus may be electrically connected to the emission control thin-film transistor T6.

The pixel electrode 210 may include a conductive oxide, such as indium tin oxide (ITO), indium zinc oxide (IZO), zinc oxide (ZnO), indium oxide (In2O3), indium gallium oxide (IGO), or aluminum zinc oxide (AZO). In another exemplary embodiment, the pixel electrode 210 may include a reflective layer including Ag, Mg, Al, Pt, Pd, Au, Ni, Nd, Ir, Cr, or a compound thereof. In another exemplary embodiment, the pixel electrode 210 may further include a layer including ITO, IZO, ZnO, or $In_2O_3$ above or below the reflective layer. In some exemplary embodiments, the pixel electrode 210 may have a stacked structure of ITO/Ag/ITO.

A pixel-defining layer 120 may cover an edge of the pixel electrode 210. The pixel-defining layer 120 overlaps the pixel electrode 210 and includes an opening defining an emission area of a pixel. The pixel-defining layer 120 may increase the distance between the edge of the pixel electrode 210 and an opposite electrode 230 on the pixel electrode 210, thereby preventing the occurrence of arcs in the edge of the pixel electrode 210. The pixel-defining layer 120 may include an organic insulating material such as polyimide, polyamide, acrylic resin, BCB, HMDSO, or phenol resin and may be formed by spin coating or the like.

An intermediate layer 220 formed to correspond to the pixel electrode 210 is arranged on the pixel-defining layer 120. The intermediate layer 220 may include a high-molecular material or a low-molecular material and may emit red, green, or blue light.

The opposite electrode 230 is arranged on the intermediate layer 220. The opposite electrode 230 may include a conductive material having a low work function. For example, the opposite electrode 223 may include a (semi) transparent layer including Ag, Mg, Al, Pt, Pd, Au, Ni, Nd, Ir, Cr, Li, Ca, or an alloy thereof. Alternatively, the opposite electrode 223 may further include a layer including ITO, IZO, ZnO, or $In_2O_3$ on the (semi) transparent layer including the above-described material. The opposite electrode 230 may be integrally formed to cover the first and second display areas DA1 and DA2 (see FIG. 1) as a whole.

The pixel electrode 210, the intermediate layer 220, and the opposite electrode 230 may form an organic light-emitting diode OLED.

A capping layer (not shown) may be formed on the opposite electrode 230. The capping layer may include LiF. Alternatively, the capping layer may include an inorganic insulating material such as silicon nitride and/or an organic insulating material. In some exemplary embodiments, the capping layer may be omitted.

Figure 5B:
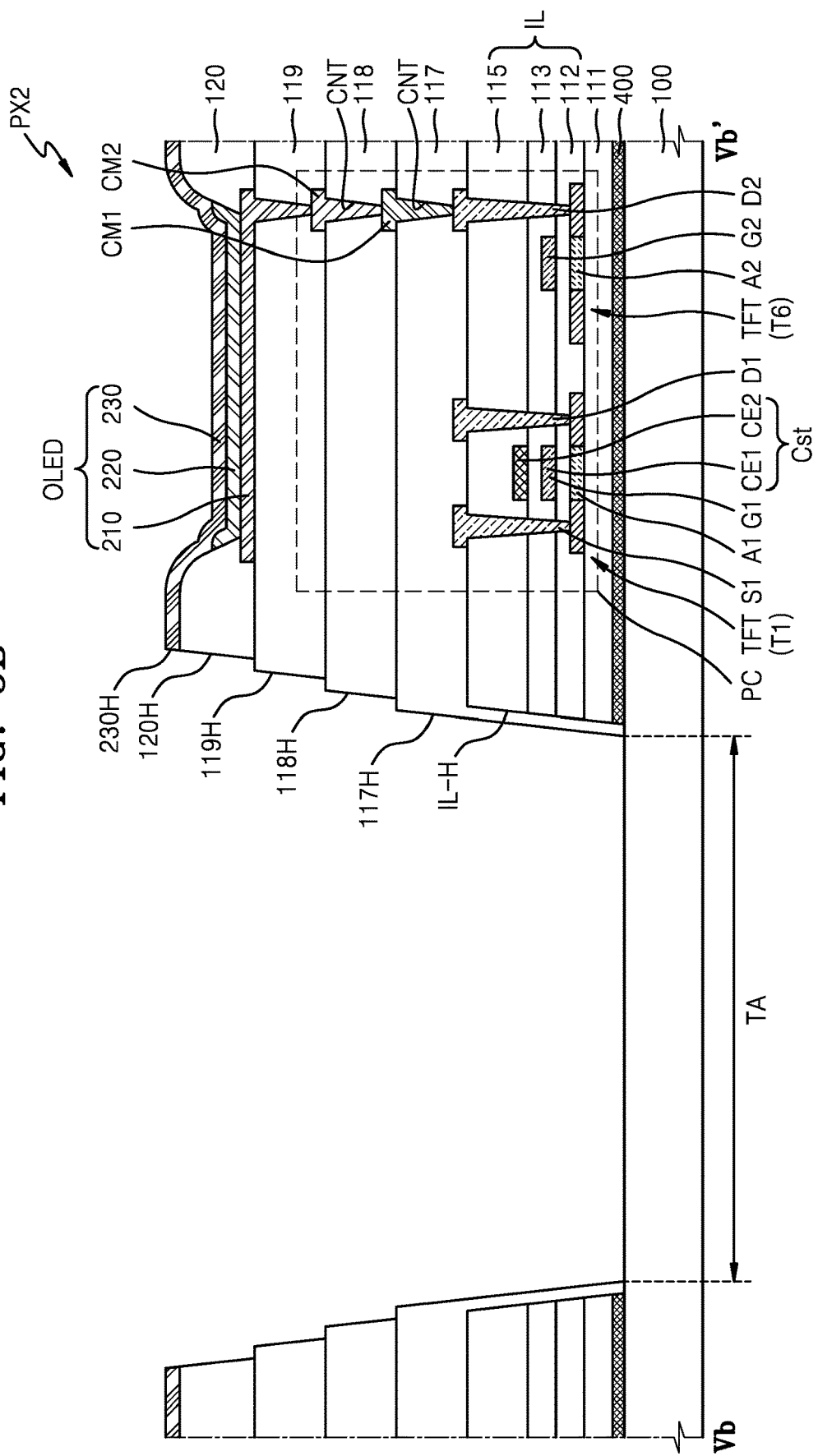
FIG. 5B is a schematic cross-sectional view taken along line Vb-Vb' in FIG. 4B.

FIG. 5B is a schematic cross-sectional view of the second pixel PX2 and a transmissive portion TA of FIG. 4B. FIG. 5B corresponds to a cross-section of the second pixel PX2 and the transmissive portion TA taken along line Vb-Vb' of FIG. 4B.

Referring to FIG. 5B, the structures of a pixel circuit PC and an organic light-emitting diode OLED in the second pixel PX2 are the same as those of the pixel circuit PC and the organic light-emitting diode OLED in the first pixel PX1 described with reference to FIG. 5A. Thus, hereinafter, differences between the first pixel PX1 and the second pixel PX2 will be mainly described.

When the first gate insulating layer 112, the second gate insulating layer 113, and the interlayer insulating layer 115 include inorganic insulating layers and are collectively referred to as an inorganic insulating structure IL, the inorganic insulating structure IL may have a first hole IL-H corresponding to a transmissive portion TA. The inorganic insulating structure IL may include a buffer layer 111, and in this case, the first hole IL-H may be formed to expose the upper surface of a substrate 100. The first hole IL-H may be formed by overlapping openings of the first gate insulating layer 112, the second gate insulating layer 113, and the interlayer insulating layer 115, wherein the openings are formed to correspond to the transmissive portion TA. The openings may be respectively formed through separate processes or may be simultaneously formed through the same process. When the openings are formed through separate processes, a step may be formed on the inner side of the first hole IL-H.

In another exemplary embodiment, the inorganic insulating structure IL may have a groove other than the first hole IL-H exposing the buffer layer 111. In another exemplary embodiment, the inorganic insulating structure IL may not have the first hole IL-H corresponding to the transmissive portion TA.

The first to third insulating layers 117, 118, and 119 may respectively have a second hole 117H, a third hole 118H, and a fourth hole 119H corresponding to the transmissive portion TA. The second hole 117H, the third hole 118H, and the fourth hole 119H may be arranged to overlap the first hole IL-H.

The pixel-defining layer 120 may include a fifth hole 120H positioned to correspond to the transmissive portion TA. The fifth hole 120H may overlap the second hole 117H, the third hole 118H, and the fourth hole 119H. The opposite electrode 230 may also include a sixth hole 230H overlapping the fifth hole 120H.

Figure 7A:
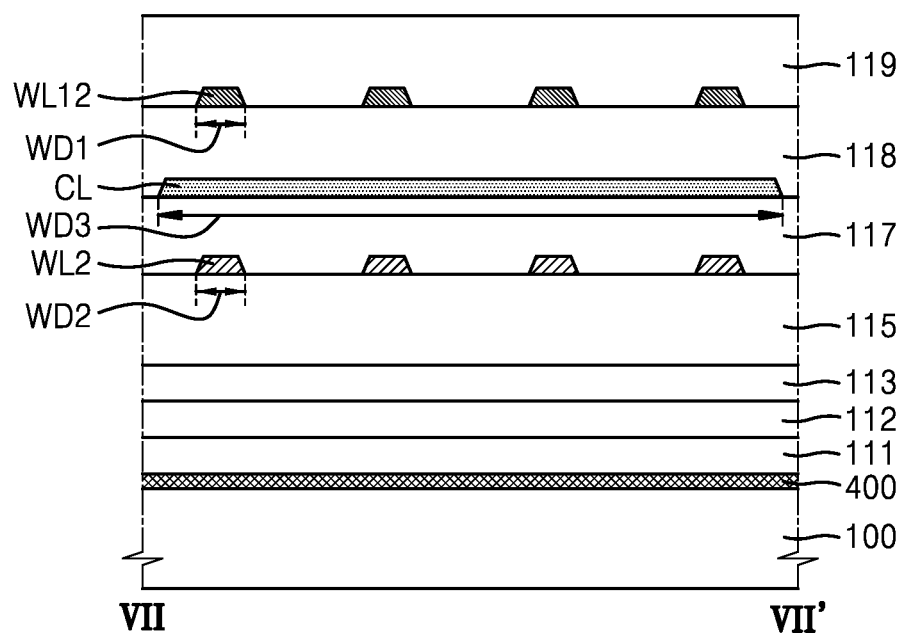
FIG. 7A is a cross-sectional view of an exemplary embodiment taken along line VII-VII' of FIG. 6E.
Figure 7B:
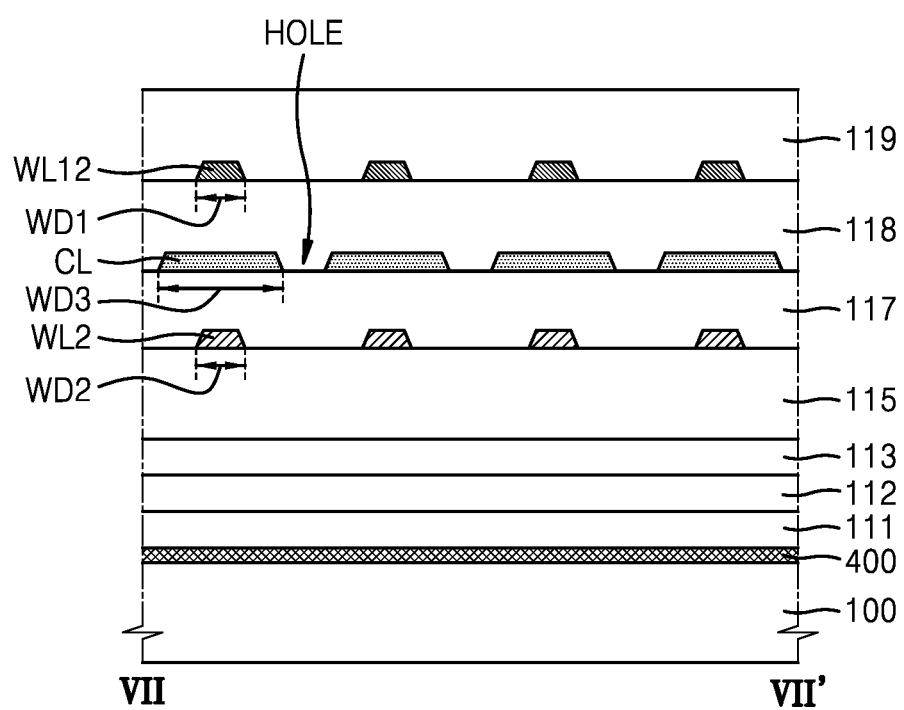

FIGS. 6A to 6E are schematic plan views illustrating an arrangement relationship between pixels and wiring lines of the display panel 10 constructed according to the principles of the invention, and FIGS. 7A and 7B are cross-sectional views of the display panel 10 taken along line VII-VII' of FIG. 6E. FIG. 8 is a cross-sectional view of the display panel 10 taken along line VIII-VIII' of FIG. 6E. For convenience of description, FIGS. 6A and 6B show some of the wiring lines shown in FIG. 6C. FIG. 6A shows a plurality of first wiring lines WL1, FIG. 6B shows a plurality of second wiring lines WL2, and FIG. 6C shows the first wiring lines WL1 and the second wiring line WL2. FIG. 6D shows a conductive layer CL and third wiring lines WL3 between the first wiring lines WL1 and the second wiring lines WL2. FIG. 6E shows the first wiring lines WL1, the second wiring lines WL2, and the conductive layer CL and the third wiring lines WL3 between the first wiring lines WL1 and the second wiring lines WL2.

As shown in FIGS. 6A, 6C and 6E, a plurality of first wiring lines WL1 may be arranged on the first display area DA1. The plurality of first wiring lines WL1 may extend in a first direction DR1 as a whole (or substantially) to connect a plurality of pixels arranged in the same column. In this case, that a wiring line 'extends in a first direction as a whole (or substantially)' may mean that the wiring line basically extends in the first direction, but in consideration of the arrangement of the wiring line, a portion of the wiring line may extend in a direction other than the first direction.

A portion of each of the first wiring lines WL1 may be arranged to pass through the second display area DA2. The first wiring line WL1 is located in both the first display area DA1 and the second display area DA2. FIG. 6A illustrates an exemplary embodiment of an arrangement of a plurality of first wiring lines WL1 extending through both the first display area DA1 and the second display area DA2.

Referring to FIG. 6A, each of the first wiring lines WL1 may include a first portion WL11 and a second portion WL12. The first portion WL11 of the first wiring line WL1 may be placed on the first display area DA1, and the second portion WL12 of the first wiring line WL1 may be placed on the second display area DA2. The first portion WL11 and the second portion WL12 may be arranged on different layers and connected to each other through a contact hole CNT.

The first wiring line WL1 may be electrically connected to a plurality of first pixels PX1 and may not be connected to a second pixel PX2. That is, first wiring lines WL1 on the second display area DA2 only bypass or pass through an area where a plurality of second pixels PX2 are located. This arrangement is caused because the number of first pixels PX1 in the first display area PA1 per equal area is different from the number of second pixels PX2 in the second display area PA2 per equal area.

For example, the first portion WL11 of the first wiring line WL1 may be electrically connected to a plurality of first pixels PX1. The second portion WL12 of the first wiring line WL1 is not connected to a second pixel PX2 and passes through an area where second pixels PX2 are located.

A first distance d1 between adjacent first wiring lines WL1 among the plurality of first wiring lines WL1 in the first display area DA1 may be greater than a second distance d2 between adjacent first wiring lines WL1 among the plurality of first wiring lines WL1 in the second display area DA2. In other words, a first distance d1 between first portions WL11 of adjacent first wiring lines WL1 is greater than a second distance d2 between adjacent second portions WL12. Accordingly, a pitch between the first wiring lines WL1 in the second display area DA2 may be reduced, and as the pitch is reduced, the area of the transmissive portion TA may be increased. The arrangement in FIG. 6A is only an example, and the plurality of first wiring lines WL1 may be variously arranged without departing from the context of the present specification.

Referring to FIG. 6B, a plurality of second wiring lines WL2 pass through the second display area DA2, but the plurality of second wiring lines WL2 may be arranged to extend in a first direction DR1 as a whole (or substantially) to connect a plurality of pixels arranged in the same column. Because the second wiring lines WL2 are arranged to extend in the first direction DR1, the second wiring lines WL2 may also be located on the first display area DA1.

Each of the second wiring lines WL2 may be electrically connected to a plurality of second pixels PX2 arranged in the same column. Unlike the first wiring line WL1, the second wiring line WL2 may also be electrically connected to a plurality of first pixels PX1 arranged in the same column as the plurality of second pixels PX2.

A third distance d3 between adjacent second wiring lines WL2 among the plurality of second wiring lines WL2 in the first display area DA1 may be greater than a fourth distance d4 between adjacent second wiring lines WL2 among the plurality of second wiring lines WL2 in the second display area DA2. Accordingly, a pitch between the adjacent second wiring lines WL2 in the second display area DA2 may be reduced, and the area of the transmissive portion TA may be increased.

In an exemplary embodiment, the first wiring lines WL1 and the second wiring lines WL2 may be data lines DL. The first wiring lines WL1 and the second wiring lines WL2 may transmit data signals to a plurality of pixels PX. Each of the plurality of first wiring lines WL1 may transmit a data signal to a plurality of first pixels PX1, and each of the plurality of second wiring lines WL2 may transmit a data signal to a plurality of first and second pixels PX1 and PX2.

FIG. 6C shows both the plurality of first wiring lines WL1 shown in FIG. 6A and the plurality of second wiring lines W2 shown in FIG. 6B.

Referring to FIG. 6C, in the second display area DA2, a portion of each first wiring line WL1 and a portion of each second wiring line WL2 may overlap each other. A portion of the second wiring line WL2 and a portion of the first wiring line WL1, for example, the second portion WL12, may correspond to each other and overlap each other. As the second portions WL12 of the first wiring lines WL1 located in the second display area DA2 overlap second wiring lines WL2 corresponding to the second portions WL12, an area occupied by wiring lines may be reduced, and thus the area of the transmissive portion TA may be increased.

FIG. 6D shows the arrangement of a plurality of third wiring lines WL3 and a conductive layer CL. In FIG. 6D, other wiring lines are not shown for convenience of description.

The plurality of third wiring lines WL3 may be located on the first display area DA1, and the conductive layer CL may be located on the second display area DA2. The conductive layer CL may be located on a different layer from the third wiring lines WL3, and the conductive layer CL and the third wiring lines WL3 may be electrically connected to each other through contact holes CNT. The conductive layer CL may correspond to portions of the third wiring lines WL3. The third wiring lines WL3 and the conductive layer CL may include the same material.

The conductive layer CL may be arranged on a different layer from the third wiring lines WL3. In addition, the conductive layer CL may be arranged on a different layer from the first portions WL11 and the second portions WL12 of the first wiring lines WL1. The conductive layer CL may be located between portions of the second wiring lines WL2 and the second portions WL12 of the first wiring lines WL1 and overlap the portions of the second wiring lines WL2 and the second portions WL12.

The third wiring lines WL3 may be arranged to extend in the first direction DR1 as a whole (or substantially) to connect a plurality of first pixels PX1 arranged in the same column. The conductive layer CL may be arranged to extend in the first direction DR1 as a whole (or substantially) to connect a plurality of second pixels PX2.

The conductive layer CL may be formed in a plate form, as shown in FIG. 6D. For example, the width of the conductive layer CL may be greater than the width of the third wiring line WL3. The width of the conductive layer CL may not be constant. The width of a portion of the conductive layer CL may be less than that of the other portion. By forming the width of the conductive layer CL differently depending on a position where the conductive layer CL is placed, the area of the transmissive portion TA may be increased. The conductive layer CL may have a hole in a portion thereof for electrical connection between a wiring line and a pixel.

In another exemplary embodiment, the conductive layer CL may have a form in which a plurality of lines are connected to one another. The shape and arrangement of the conductive layer CL of FIG. 6D are only examples, and the conductive layer CL may be arranged in various shapes.

Each of the third wiring line WL3 may be electrically connected to a plurality of first pixels PX1, and the conductive layer CL may be electrically connected to a plurality of second pixels PX2. The plurality of third wiring lines WL3 and the conductive layer CL may correspond to the driving voltage line PL supplying a power voltage.

FIG. 6E shows an example of the arrangement of the first wiring lines WL1, the second wiring lines WL2, the conductive layer CL between the first wiring lines WL1 and the second wiring lines WL2, and the third wiring lines WL3, which are described above.

The second portion WL12 of the first wiring line WL1, the second wiring line WL2, and the conductive layer CL may be arranged to overlap one another. The third wiring lines WL3 may not overlap the first portion WL11 of the first wiring line WL1 and the second wiring line WL2.

FIGS. 7A and 7B are cross-sectional views of the display panel 10 taken along the line VII-VII' of FIG. 6E, and show cross-sections of second wiring lines WL2, second portions WL12 of first wiring lines WL1, and a conductive line CL, which are located on the second display area DA2. FIG. 8 is a cross-sectional view of the display panel 10 taken along the line VIII-VIII' of FIG. 6E, and shows cross-sections of a first wiring line WL1 including a first portion WL11 and a second portion WL12, a second wiring line WL2, and a conductive layer CL.

Referring to FIG. 7A, a portion (e.g. a second portion WL12) of the first wiring lines WL1 may overlap a portion of the second wiring line WL2.

As described above with reference to FIG. 6A and as shown in FIG. 8, the first portion WL11 and the second portion WL12 of the first wiring line WL1 may be located on different layers. The first portion WL11 may be located on the interlayer insulating layer 115, and the second portion WL12 may be located on the second insulating layer 118. The second wiring line WL2 may be located on the same layer as a portion of the first wiring line WL1, for example, the first portion WL11.

The first portion WL11 and the second portion WL12 of the first wiring line WL1 may be electrically connected to each other through a contact hole CNT formed in the first insulating layer 117 and the second insulating layer 118, as shown in FIG. 8. The first portion WL11 and the second portion WL12 of the first wiring line WL1 may include the same material.

The second portion WL12 of the first wiring line WL1 and the second wiring line WL2 may overlap each other as shown in FIG. 8. The first and second insulating layers 117 and 118 may be between the second portion WL12 of the first wiring line WL1 and the second wiring line WL2, as shown in FIG. 7A. The conductive layer CL may be arranged between the first insulating layer 117 and the second insulating layer 118.

The first wiring lines WL1 and the second wiring lines WL2 may be data lines transmitting data signals. When the data lines overlap each other, a parasitic capacitance may be caused therebetween, and a problem such as a delay in a data signal may occur. However, by arranging the conductive layer CL between the first wiring line WL1 and the second wiring line WL2 to overlap the first wiring line WL1 and the second wiring line WL2, it is possible to reduce the problem of parasitic capacitance that may occur between overlapping data lines DL.

The conductive layer CL may be electrically connected to the third wiring line WL3, as shown in FIG. 8. The conductive layer CL may be electrically connected to the third wiring line WL3 through a contact hole CNT formed in the first insulating layer 117. The conductive layer CL and the third wiring line WL3 may include the same material or include different materials.

As shown in FIG. 7A, a width WD3 of the conductive layer CL between the first wiring line WL1 and the second wiring line WL2 may be greater than a width WD1 of the second portion WL12 of the first wiring line WL1 and may also be greater than a width WD2 of the second wiring line WL2. In some exemplary embodiments, the conductive layer CL may be arranged to overlap second portions WL12 of a plurality of first wiring lines WL1, and a plurality of second wiring lines WL2.

As another exemplary embodiment, as shown in FIG. 7B, the conductive layer CL may include a hole HOLE located between neighboring wiring lines. Also in this structure, the width WD3 of the conductive layer CL between the first wiring line WL1 and the second wiring line WL2 may be greater than the width WD1 of the second portion WL12 of the first wiring line WL1 and may also be greater than the width WD2 of the second wiring line WL2.

According to the above-described exemplary embodiments, a display panel, in which a display area is expanded such that an image may be expressed even in an area where an electronic component is arranged, and an electronic device including the display panel may be implemented. In particular, by increasing the area of a transmissive portion through which light/signals of the electronic component pass, a display panel having various functions and an expanded display area may be implemented.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel comprising:
   a first display area including a plurality of first pixels;
   a second display area surrounded by the first display area and including at least one transmissive portion and a plurality of second pixels spaced apart from each other with the transmissive portion therebetween;
   a plurality of first wiring lines electrically connected to the plurality of first pixels and substantially extending in a first direction; and
   a plurality of second wiring lines electrically connected to the plurality of second pixels and substantially extending in the first direction,
   wherein at least one of the plurality of first wiring lines includes:
   a first portion; and
   a second portion located on a different layer from the first portion and overlapping one of the plurality of second wiring lines.

2. The display panel of claim 1, further comprising a conductive layer located between the second portion of the at least one first wiring line and the one second wiring line.

3. The display panel of claim 2, wherein the conductive layer overlaps the second portion of the at least one first wiring line and the one second wiring line.

4. The display panel of claim 2, further comprising a plurality of third wiring lines electrically connected to the plurality of first pixels or the plurality of second pixels and substantially extending in the first direction,
   wherein the conductive layer is electrically connected to the plurality of third wiring lines.

5. The display panel of claim 4, further comprising an insulating layer located between the third wiring line and the conductive layer,
   wherein the conductive layer is connected to the third wiring line through a contact hole of the insulating layer.

6. The display panel of claim 2, further comprising a first insulating layer and a second insulating layer located between the first portion and the second portion,
   wherein the conductive layer is located between the first insulating layer and the second insulating layer.

7. The display panel of claim 6, wherein each of the first insulating layer and the second insulating layer includes an organic insulating material.

8. The display panel of claim 6, wherein each of the first insulating layer and the second insulating layer includes a hole corresponding to each of the plurality of transmissive portions.

9. The display panel of claim 2, wherein a width of the conductive layer is greater than each of widths of the first and second wiring lines.

10. The display panel of claim 1, wherein a first distance between adjacent first wiring lines among the plurality of first wiring lines in the first display area is greater than a second distance between adjacent first wiring lines among the plurality of first wiring lines in the second display area.

11. The display panel of claim 1, wherein, a third distance between adjacent second wiring lines among the plurality of second wiring lines in the first display area is greater than a fourth distance between adjacent second wiring lines among the plurality of second wiring lines in the second display area.

12. The display panel of claim 1, further comprising a light-blocking layer located under the second pixels.

13. The display panel of claim 12, wherein the light-blocking layer includes a metal or black ink.

14. The display panel of claim 1, wherein each of the plurality of first wiring lines transmits a data signal to the plurality of first and second pixels, and
   each of the plurality of second wiring lines transmits a data signal to the plurality of first pixels.

15. The display panel of claim 1, wherein, per equal area, the number of second pixels is less than the number of first pixels.

16. An electronic device comprising:
   a display panel including a first display area and a second display area surrounding the first display area; and
   an electronic component arranged to correspond the second display area of the display panel,
   wherein the display panel includes:
   a plurality of first pixels arranged in the first display area;
   at least one transmissive portion and a plurality of second pixels spaced apart from each other with the transmissive portion therebetween arranged in the second display area;
   a plurality of first wiring lines electrically connected to the plurality of first pixels and substantially extending in a first direction; and
   a plurality of second wiring lines electrically connected to the plurality of second pixels and substantially extending in the first direction,
   wherein a portion of at least one of the plurality of first wiring lines and a portion of at least one of the plurality of second wiring lines overlap each other around the transmissive portion.

17. The electronic device of claim 16, wherein the electronic component includes an imaging device or a sensor.

18. The electronic device of claim 16, wherein the display panel further includes a conductive layer located between the portion of the at least one first wiring line and the portion of the at least one second wiring line.

19. The electronic device of claim 18, wherein the conductive layer overlaps the portion of the at least one first wiring line and the portion of the at least one second wiring line.

20. The electronic device of claim 18, wherein a width of the conductive layer is greater than each of widths of the first and second wiring lines.

* * * * *